United States Patent
Lei et al.

(10) Patent No.: US 7,052,302 B2
(45) Date of Patent: May 30, 2006

(54) SOCKET CONNECTOR HAVING KEYING MEANS

(75) Inventors: Jinfeng Lei, Kunsan (CN); Wei Yu, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/025,193

(22) Filed: Dec. 28, 2004

(65) Prior Publication Data

US 2005/0186809 A1    Aug. 25, 2005

(30) Foreign Application Priority Data

Feb. 20, 2004    (TW)    ............... 93104252 A

(51) Int. Cl.
*H01R 4/50*    (2006.01)

(52) U.S. Cl. ................................... 439/342; 439/259

(58) Field of Classification Search ............... 439/168, 439/259, 331, 342, 681
See application file for complete search history.

(56) References Cited

U.S. PATENT DOCUMENTS

| | | | |
|---|---|---|---|
| 5,595,512 A * | 1/1997 | Langdon | ............ 439/812 |
| 6,296,506 B1 | 10/2001 | Mizumura et al. | |
| 6,338,640 B1 | 1/2002 | Lin | |
| 6,692,281 B1 | 2/2004 | McClinton et al. | |
| 2005/0064742 A1* | 3/2005 | Ma et al. | ............ 439/70 |
| 2005/0186809 A1* | 8/2005 | Lei et al. | ............ 439/68 |

* cited by examiner

*Primary Examiner*—James R. Harvey
(74) *Attorney, Agent, or Firm*—Wei Te Chung

(57) ABSTRACT

A socket connector (100) includes a socket base (12), a socket cover (13) slidable mounted on the socket base, a base plate (17) received in a recessed area (125) defined in the socket base, and an eccentric cam member (15) rotatable engaging with the socket cover, the socket base and the base plate so as to actuate the socket cover to move with respective to the socket base between an open position and a closed position. Keying means (172, 1252) is provided between the base plate and the recessed area so as to prevent the base plate from mismating with the socket base.

3 Claims, 5 Drawing Sheets

SOCKET CONNECTOR HAVING KEYING MEANS

BACKGROUND OF THE INVENTION

1. Field of the Invention

The present invention relates to an electrical connector, and more particularly to a socket connector for electrically interconnection with a pin grid array (PGA) package to a printed circuit board (PCB).

2. Description of Prior Arts

Integrated circuits (ICs) are becoming smaller, more complex, and more prevalent. It is common for a modern electronic appliance, such as a computer, to have several IC components attached to a circuit board. Each IC is generally delivered as an enclosed package with a pin grid array (PGA) interface. The PGA interface is a set of electrically conductive pins arranged in a pattern, where each pin is an electrical connection to the functional portion of the IC. In order to install the IC in an electronic appliance, the pins must be electrically connected to appliance's main circuit board. It is thus desirable for there to be a simple mechanism that permits the IC to be quickly and easily attached to the circuit board, while minimizing the risk of damage.

One device that permits a simple, fast connection between an IC and a circuit board is a Zero Insertion Force (ZIF) socket assembly. A ZIF socket assembly is a device having set of contacts in electrical connection with the circuit board, where the contacts are disposed in a set of sockets. The device is arranged such that the pins of the IC can be inserted into the sockets without touching the contacts so that the pins do not encounter frictional resistance as they are inserted. Subsequent to the insertion of the pins, the device brings the pins and contacts into electrical connection, such that electrical impulses can flow freely between the pins and the circuit board by way of the contacts.

A number of ZIF socket devices have been proposed. A typical ZIF socket assembly may utilize a plastic socket cover that is slidably movable on a plastic socket base between an open position and a closed position. Generally, an actuating mechanism is used to drive the cover and the base between the open and closed positions. One type of actuating mechanism according to the prior art is an eccentric cam shaft which is basically in the form of a screw member which is operated by an appropriate tool, such as a screwdriver. The eccentric cam shaft has an eccentric portion engageable with the socket cover and moving the socket cover relative to the socket base.

Generally, referring to FIG. 1, the ZIF socket assembly further includes a plate 27 that is retained in a recessed area 225 on a bottom of the socket base 22, wherein the plate 27 is formed of metal or another suitably hard materials to absorb forces created by the eccentric cam shaft, thereby protecting plastic area of the socket base 22 from cracking and giving the ZIF socket assembly a long-life span. More specifically, for some demands, the plate 27 has a rough surface facing the bottom of the recessed area and a slippery surface opposite to the rough surface facing exterior to be cooperated with other subassembly (not shown). However, since the conventional plate 27 is geometrical symmetry, the ZIF socket assembly is suffered from several drawbacks, and particularly, problem will be encountered in attempting to assemble the plate 27 to the recessed area 225 of the socket base 22. During the course of assembling, the rough surface of plate 27 is inclined to mistakenly face exterior without notice so as to wear and tear the subassembly, resulting in a shorten life of the subassembly.

In light of the problem, an improved socket connector is desired to overcome the drawback of the prior arts.

SUMMARY OF THE INVENTION

Accordingly, the main object of the present invention is to provide a socket connector having keying means which is provided between a base plate and a recessed area on a socket base for preventing mismating.

To fulfill the above-mentioned object, a socket connector according to the present invention comprises a socket base, a socket cover slidable mounted on the socket base, a base plate received in a recessed area defined in the socket base, and an eccentric cam member rotatable engaging with the socket cover, the socket base and the base plate so as to actuate the socket cover to move with respective to the socket base between an open position and a closed position. Keying means is provided between the base plate and the recessed area so as to prevent the base plate from mismating with the base.

Other objects, advantages and novel features of the invention will become more apparent from the following detailed description of the present embodiment when taken in conjunction with the accompanying drawings.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE PREFERRED EMBODIMENT

Reference will now be made to the drawings to describe the present invention in detail.

Figure 1:
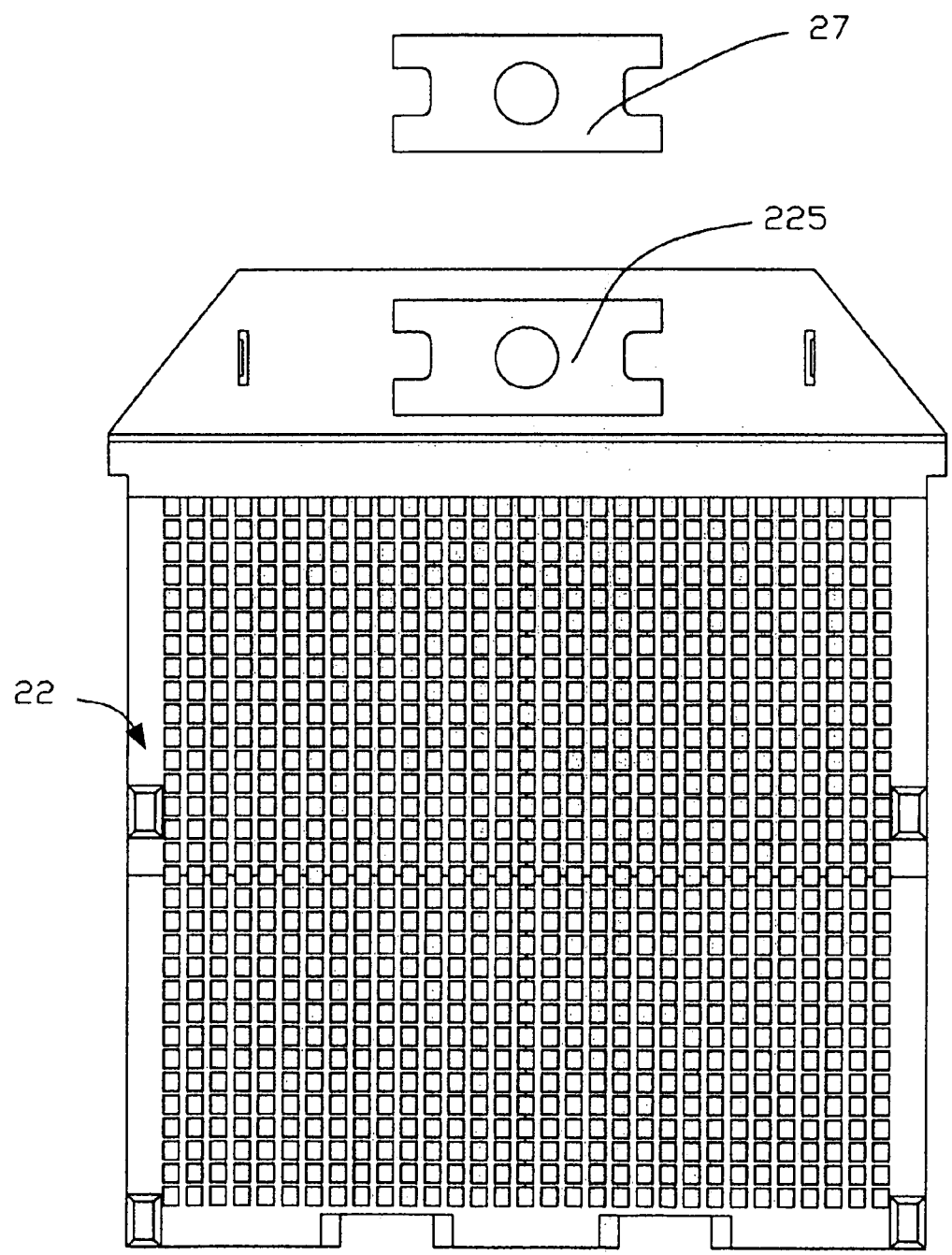
FIG. 1 is a partially exploded, bottom view showing a conventional base plate and a corresponding recessed area on a bottom of a socket base.
Figure 2:
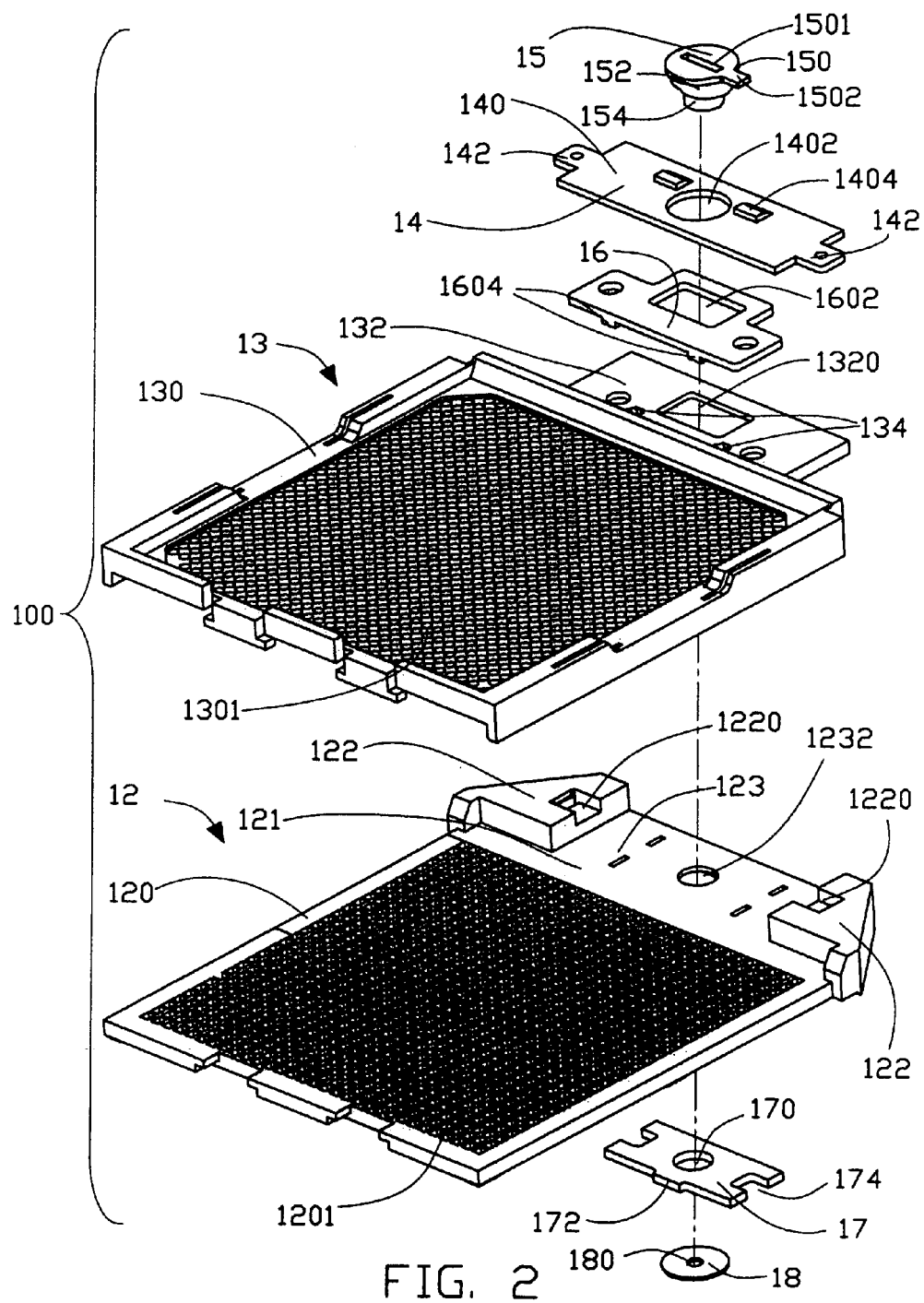
FIG. 2 is an exploded, perspective view of a socket connector in accordance with the present invention.

FIG. 2 illustrates an exploded view of a socket connector 100 in accordance with a preferred embodiment of the present invention. The socket connector comprises an insulated socket base 12, an insulated socket cover 13 slidably mounted on the socket base 12, and a metallic eccentric cam member 15 rotationally embedded in the socket base 12 and the socket cover 13 for actuating the socket cover 132 to slide along the socket base 12 between an open position and a closed position.

The socket base 12 is generally in shape of a rectangular, and comprises an insulative base housing 120 and a base extension 121 extending from one side of the base housing 120. The base housing 120 defines a plurality of base passages 1201 extending vertically therethrough to receiving a plurality of contacts (not shown). The base extension 121 forms a pair of spaced standoffs 122 extending upwardly from opposite sides of upper face thereof, and accordingly defines a receiving space 123 therebetween, wherein each of the standoffs 122 defines a small rectangular depression 1220 communicating with the receiving space 123. Furthermore, referring to FIG. 2 in conjunction with FIG. 3, the base extension 121 defines a downwardly opening recessed area 125 in the middle of bottom face and a roundish base hole 1232 extending through bottom of the recessed area 125 to communicate with the receiving space 123. The recessed area 125 is generally in H-shaped that receives a base plate 17. A U-shaped notch 1252 is cut into the base 12 from one elongated side of the recessed area 125, wherein a centerline of the notch 1252 is offset to that of the recessed area 125.

Figure 3:
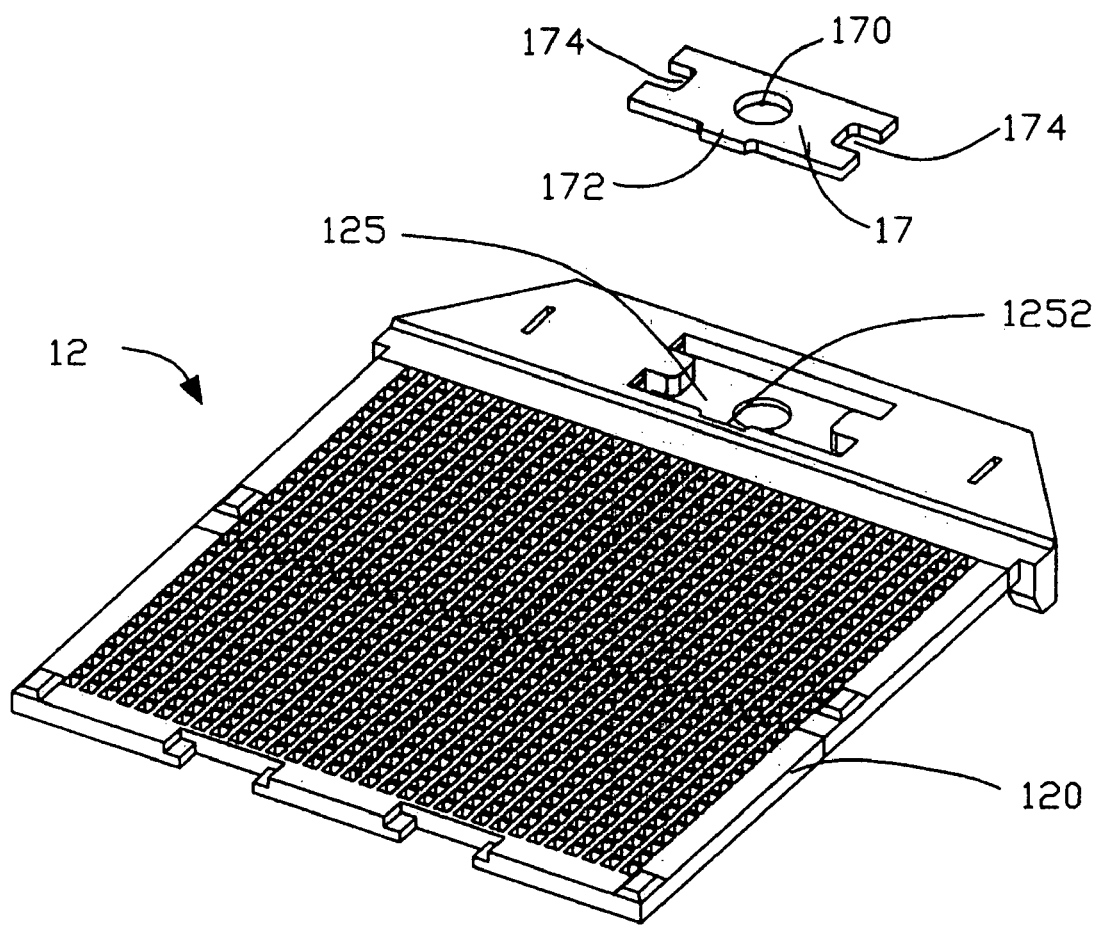
FIG. 3 is a partially exploded, perspective view showing a base plate and a socket base in accordance with the present invention.
Figure 4:
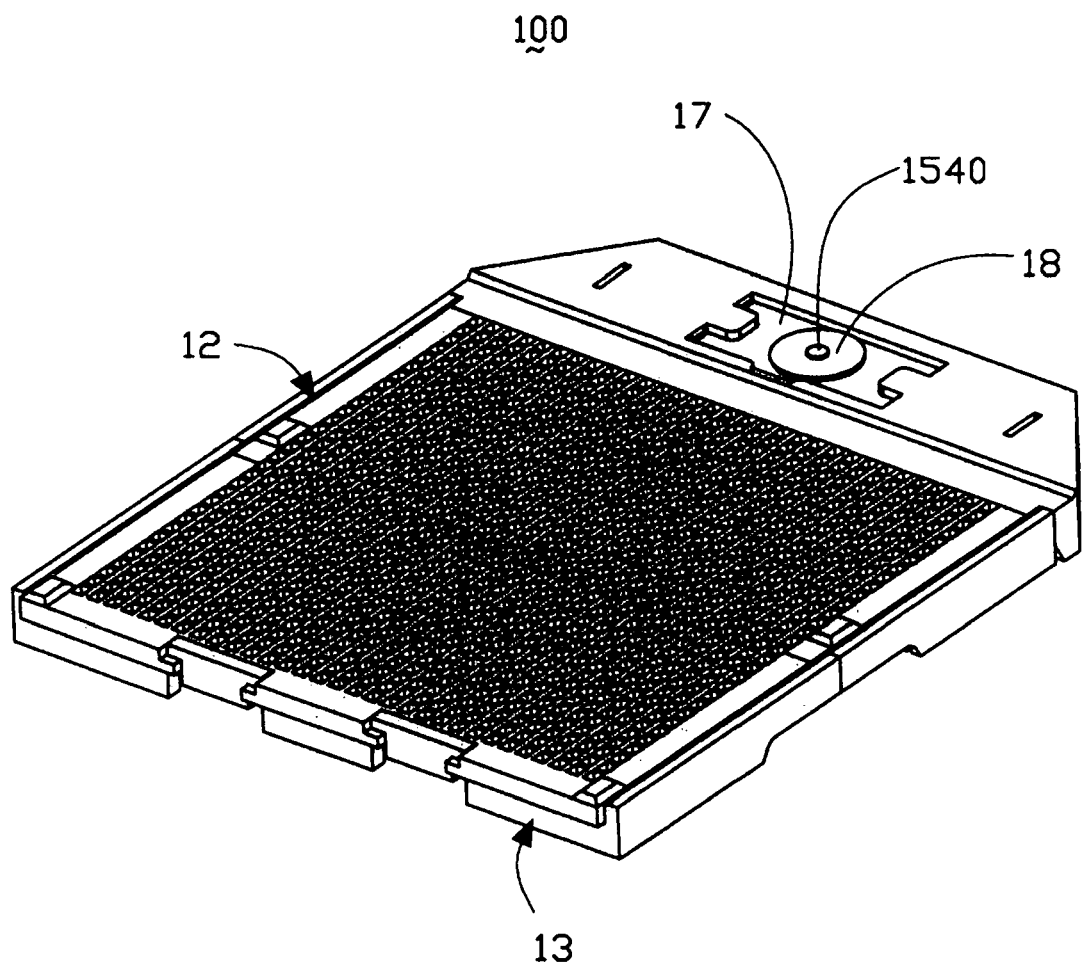
FIG. 4 is an assembled, perspective view of the socket connector in accordance with the present invention.
Figure 5:
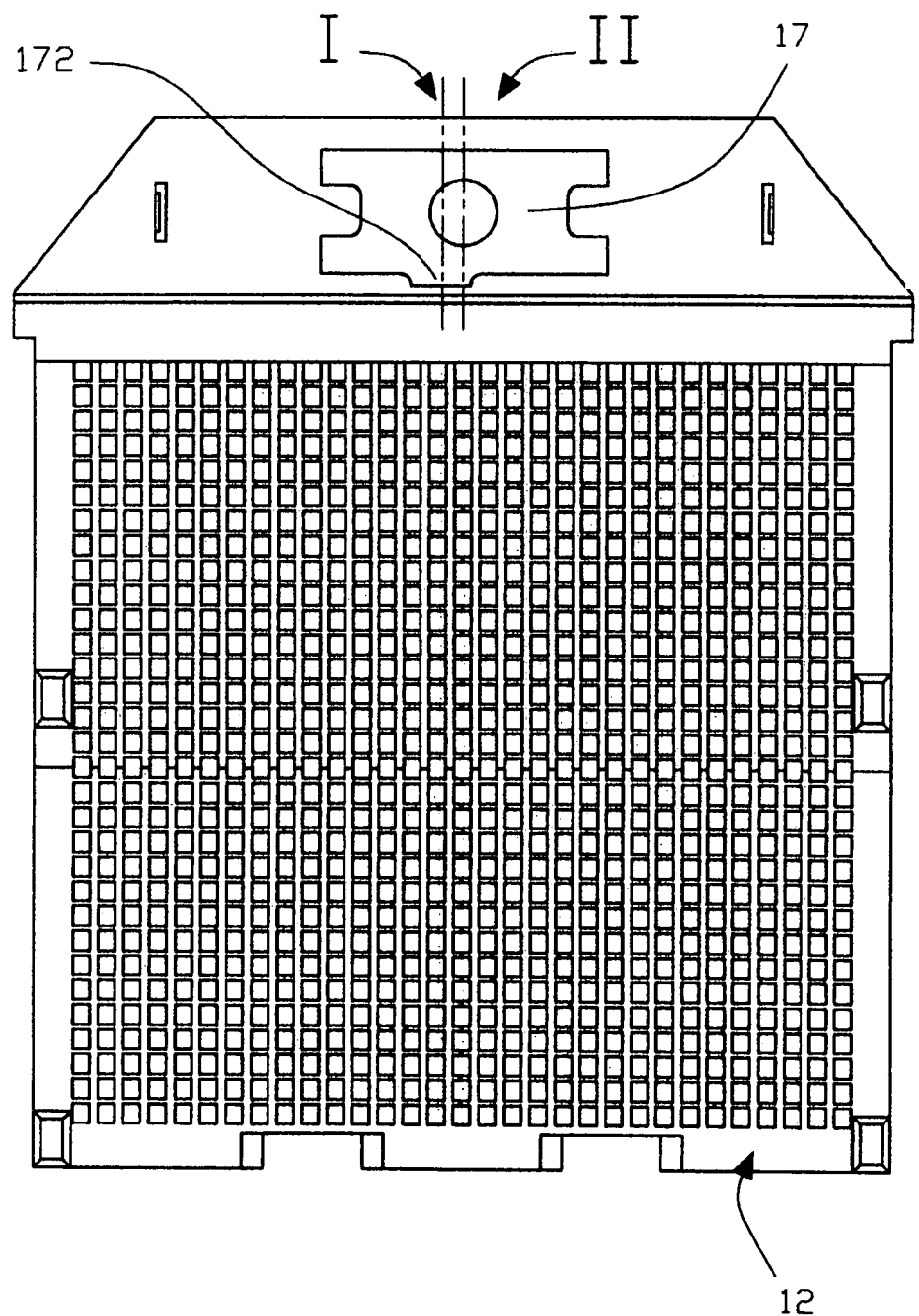
FIG. 5 is an assembled, bottom plan view of the base plate and the socket base of FIG. 3.

Referring to FIGS. 3–5, the base plate 17 is formed of metal or another suitably hard materials. For some special demands, the base plate 17 has a rough upper surface facing the bottom of the recessed area 125 and a lower slippery surface opposite to the rough upper surface. In the preferred embodiment of the present invention, the base plate 17 is generally H-shaped configuration corresponding to the shape of the recessed area 125, and defines a pair of cutouts 174 cut from opposite lateral sides thereof and a roundish base plate hole 170 going halves the cutouts 174. Furthermore, the base plate 17 has a rectangular projection 172 projecting outwardly from one elongated side thereof to be received in the notch 1252 of the base 12, wherein a centerline I of the projection 172 is offset to a centerline II the base plate 17 and in align with that of the notch 1252 as best shown in FIG. 5.

Returning to FIG. 2, the socket cover 13 has a shape corresponding to that of the socket base 12, and comprises an insulative cover housing 130 and a cover extension 132 extending from one side of the cover housing 130 to be received in the receiving space 123 of the base 12. The cover housing 130 defines a plurality of cover passages 1301 in alignment with the base passages 1201 of the base housing 120 for receiving a plurality of pins of pin grid array (PGA) package. The cover extension 132 defines a rectangular cover hole 1320 in middle thereof and a pair of indentions 134 nearest the cover housing 130 and spaced by the cover hole 1320.

A T-shaped cover plate 16 is provided above the cover extension 132 of the socket cover 13. The cover plate 16 is a planar plate of metal or another suitably hard materials and defines a rectangular cover plate hole 1602 in alignment with the cover hole 1320 and a pair of embossments 1604 extending downwardly from bottom face thereof for being fitted into the indentions 134 of the cover 13.

The eccentric cam member 15 comprises an upper portion 150, a middle portion 152 and a lower portion 154, wherein the upper portion 150, the middle portion 152 and the lower portion 154 are generally in shape of cylindrical, but have taper-off diameters. The upper portion 150 defines an elongated groove 1501 recessed in upper face thereof for receiving a blade-like external tool (not shown) such as a screwdriver and forms a lateral protrusion 1502 outwardly protruding beyond a part of periphery thereof. The middle portion 152 is overlapped by the upper portion 150 along perimeter thereof. The lower portion 154 is formed beneath the middle portion 152 and has a riveting end 1540 (shown in FIG. 4) at a lower end thereof. It is to be noted that a rotational axis of the middle portion 152 is offset from a rotational axis of the upper portion 150 (shown in FIG. 5), and elaboration will be given hereinafter.

A cam plate 14 is provided as a planar plate of metal or another suitably hard materials and has an elongated main body 140 and a pair of ears 142 extending outwardly from opposite lateral sides of the main body 140. The main body 140 defines a roundish cam plate hole 1402 in a middle thereof and forms a pair of cam stoppers 1404 symmetrically on opposite sides of the cam plate hole 1402 along a horizontal direction. The cam stoppers 1404 are apt to prevent the eccentric cam member 15 from been over rotated between the open and the closed positions when the socket connector 100 is fully assembled.

In addition, the socket connector 100 comprises a washer 18 also made of metal or another suitably hard materials. The washer 18 is a round in shape and defines an aperture 180 in middle thereof for receiving the riveting end 1540 of the eccentric cam member 15.

In assembly, the base plate 17 is fitted into the recessed area 125 of the socket base 12 such that the projection 172 is received in the notch 1252. Successively, the socket cover 13 together with the cover plate 16 is assembled onto the socket base 12, and the cam plate 14 is assembled onto the socket base 12 and above the cover plate 16. The cover extension 132 of the cover 13, the cover plate 16 attached to the cover extension 132, and the cam plate 14, are disposed in the receiving space 123 of the socket base 12. The ears 142 of the cam plate 14 engage with the depressions 1220 of the standoffs 122 for securing the cam plate 14 in position. At this time, the base plate hole 170, the base hole 1232, the cover hole 1320, the cover plate hole 1602 and the cam plate hole 1402, respectively, are all aligned and commonly receive the eccentric cam member 15. Finally, the washer 18 is assembled to the riveting end 1540 of the eccentric cam member 15. In such a way, the eccentric cam member 15 is rotatably secured to the socket base 12 and the socket cover 13 and the socket connector 100 is fully assembled.

In operation, after the PGA package is loaded on the socket cover 13, the eccentric cam member 15 is rotated by the external tool until the lateral protrusion 150 engages with one of cam stoppers 1404. During the process, since the rotational axis of the middle portion 152 is offset from the rotational axis of the upper portion 150, the middle portion 152 of the eccentric cam member 15 abuts against inner segments of the cover plate hole 1602 and the cover hole 1320 to apply forces against the socket cover 13, synchronously, the socket cover 13 slides along the base 12 in a closed position, wherein the pins of the PGA package electrically connect with corresponding contacts retained in the socket base 12. To open the connection between the pins and the contacts, the eccentric cam member 15 is rotated in an opposite direction from one of the cam stoppers 1404, to the other cam stoppers 1404. For the same reason, the socket cover 13 slides along the socket base 12 in an open position, thereby allowing the PGA chip to be removed from the socket connector 100.

During the operation, since the cam plate 14, the cover plate 16, the base plate 17 and the washer 18 are made of metal or another suitably hard materials, plastic area of the base extension 121 and the cover extension 132 abutted against by the eccentric cam member 15 is protected, thereby giving the socket connector 100 a long-life span and enhancing the retention between the socket base 12 and the socket cover 13.

In the preferred embodiment, keying means is provided between the base plate 17 and the recessed area 125 of the socket base 12 so as to prevent the base plate 17 from mismating with the socket base 12. The keying means includes the projection 172 projecting from one elongated side of the base plate 17 and the notch 1252 notched into the socket base 12 from the recessed area 125 for receiving the projection 172, wherein the centerline I of the projection 172 is offset to the centerline II of the base plate 17.

In one alternative embodiment, the keying means may be located in different positions between the base plate 17 and the recessed area 125, for example, the projection 172 projecting from one lateral side of the base plate and the notch 1252 notched from corresponding position of the recessed area 125, or plurality of projections 172 suited and asymmetric projecting from base plate 17 and plurality of notches notched from corresponding positions of the recessed area 125.

In another alternative embodiment, the keying means is also provided between the base plate 17 and the recessed area 125, but employs an opposite co-work relationship, for example, the projection 172 projecting from one inner wall of the recessed area 125 and the notch 1252 notched into corresponding position of the base plate 17 for receiving the projection 172, so do the plurality of projections 172 and the corresponding notches 1252.

In further alternative embodiment, the base plate 17 and the corresponding recessed area 125 may have any variety of different shapes and sizes, such as circular, rectangular, star-shaped, triangular, hexagonal, or any other geometric or non-symmetric shape.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket connector comprising:
   a socket base having a base extension defining a recessed area for receiving a base plate;
   a socket cover sideably mounted on the socket base and having a cover extension corresponding to the base extension;
   an eccentric cam member rotatable engaging with the cover extension, the base extension and the base plate so as to actuate the socket cover to move with respective to the socket base between an open position and a closed position; and
   keying means provided between the base plate and the recess area of the base extension so as to prevent the base plate from mismating with the socket base;
   a cover plate assembled with the cover extension of the cover and a cam plate placed above the cover plate, the base extension, the cover extension, the cam plate, the cover plate and the base plate each define a through hole for commonly receiving the eccentric cam member; wherein
   the cam plate forms a pair of cam stoppers on opposite sides of the through hole, and wherein the eccentric cam member has an outwardly eccentric protrusion abutting against the cam stoppers in the open and closed positions preventing from overrotating.

2. The socket connector as described in claim 1, wherein the socket connector further comprises a washer defining an aperture for riveting an end of the eccentric cam member so as to secure the eccentric cam member to the socket base and the socket cover.

3. The socket connector as described in claim 2, wherein the eccentric cam member, the cam plate, the cover plate, the base plate and the washer are formed of metal or another suitably hard material.

* * * * *